United States Patent
Panteleev et al.

(10) Patent No.: US 8,176,397 B2
(45) Date of Patent: May 8, 2012

(54) VARIABLE REDUNDANCY REED-SOLOMON ENCODER

(75) Inventors: Pavel Panteleev, Moscow (RU); Alexandre Andreev, San Jose, CA (US); Elyar Gasanov, Moscow (RU); Ilya Neznanov, Moscow (RU)

(73) Assignee: LSI Corporation, Milpitas, CA (US)

( * ) Notice: Subject to any disclaimer, the term of this patent is extended or adjusted under 35 U.S.C. 154(b) by 903 days.

(21) Appl. No.: 12/211,985

(22) Filed: Sep. 17, 2008

(65) Prior Publication Data

US 2010/0070831 A1    Mar. 18, 2010

(51) Int. Cl.
*G06F 11/00* (2006.01)
(52) U.S. Cl. .................... 714/784; 714/785
(58) Field of Classification Search .......... 714/748, 714/785, 755, 756, 781, 752, 786
See application file for complete search history.

(56) References Cited

U.S. PATENT DOCUMENTS

| | | | |
|---|---|---|---|
| 5,444,719 A | 8/1995 | Cox et al. | |
| 5,757,826 A * | 5/1998 | Fredrickson | 714/784 |
| 5,946,328 A * | 8/1999 | Cox et al. | 714/784 |
| 6,047,395 A | 4/2000 | Zook | |
| 6,408,339 B1 * | 6/2002 | Wirkestrand | 709/245 |
| 6,978,415 B1 * | 12/2005 | Weng | 714/781 |
| 7,082,564 B2 | 7/2006 | Fredrickson et al. | |
| 7,516,394 B2 * | 4/2009 | Ashley et al. | 714/784 |
| 7,581,155 B2 * | 8/2009 | Lee et al. | 714/779 |

* cited by examiner

*Primary Examiner* — Dieu-Minh Le
(74) *Attorney, Agent, or Firm* — Alexander J. Neudeck; Cochran Freund & Young LLC

(57) ABSTRACT

A fixed length Reed-Solomon encoder is configured to produce a first fixed number of redundant symbols. The fixed length Reed-Solomon encoder is configured with an encoding polynomial that is fixed. A symbol preprocessor maps each input data symbol to a transformed input data symbol. A symbol postprocessor maps a second fixed number of redundant symbols output from the fixed length Reed-Solomon encoder to a set of redundant symbols. The second fixed number of redundant symbols is less than the first fixed number of redundant symbols.

14 Claims, 3 Drawing Sheets

Figure 1:
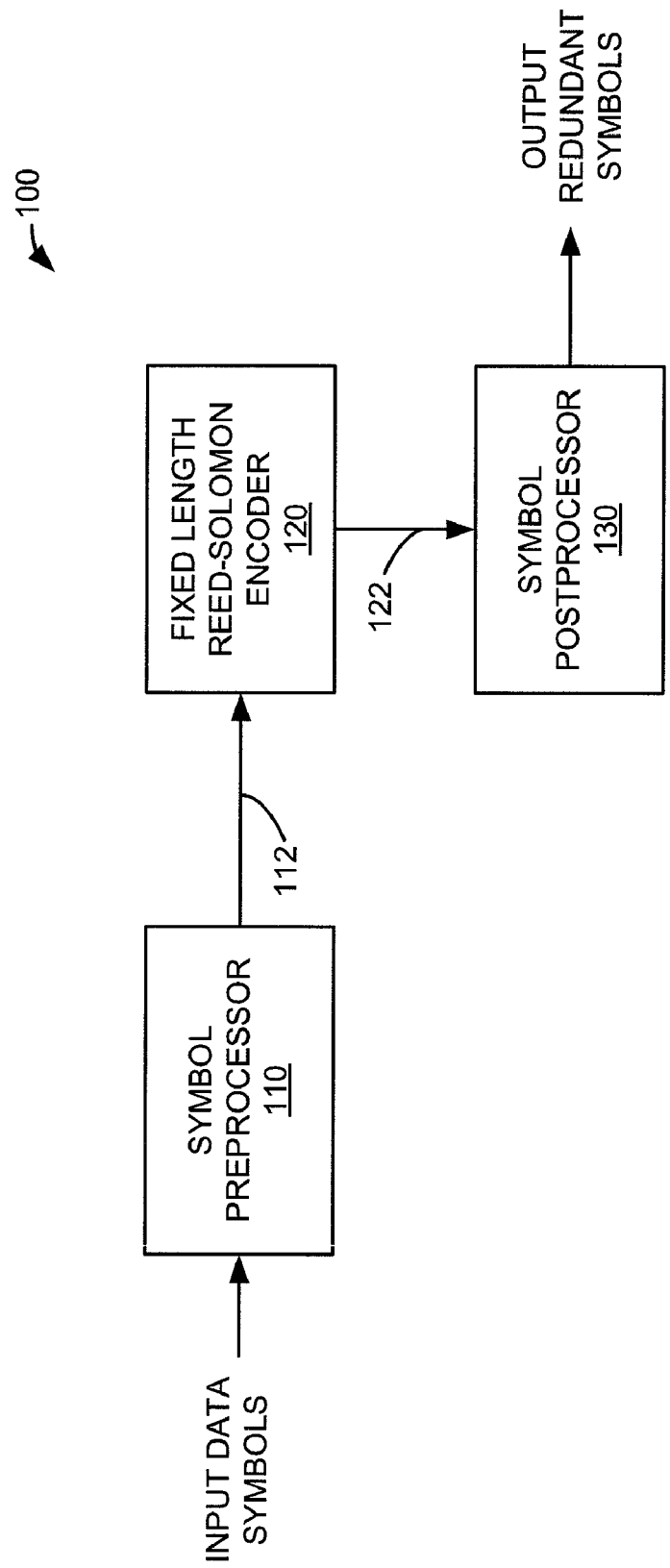

VARIABLE REDUNDANCY REED-SOLOMON ENCODER

BACKGROUND OF THE INVENTION

An error-correcting code (ECC) or forward error correction (FEC) code are codes in which each data signal conforms to specific rules of construction so that errors in the received signal can be detected and corrected. These codes are often used in computer data storage and in data transmission.

A powerful class of error-correcting codes are Reed-Solomon (RS)codes. Reed-Solomon error correction works by oversampling a polynomial constructed from the data. The polynomial is evaluated at multiple points. The results of these evaluations are sent or recorded. Sampling the polynomial more often than is necessary makes the polynomial over-determined. As long as the receiver gets many of the points correctly, the receiver can recover the original polynomial even in the presence of a few erroneous points. Reed-Solomon codes are used in a wide variety of commercial applications. For example, Reed-Solomon codes are used in CDs and DVDs. Reed-Solomon codes are also used in data transmission technologies such as Digital Subscriber Loop (DSL), WIMAX, Digital Video Broadcasting (DVB), and digital television.

SUMMARY OF THE INVENTION

An embodiment of the invention may therefore comprise a Reed-Solomon encoder with a variable number of redundant symbols, comprising: a fixed length Reed-Solomon encoder configured to produce a first fixed number of redundant symbols, the fixed length Reed-Solomon encoder being configured with an encoding polynomial that is fixed; a symbol preprocessor that maps each input data symbol to a transformed input data symbol; a symbol postprocessor that maps a second fixed number of redundant symbols output from the fixed length Reed-Solomon encoder to a set of redundant symbols, the second fixed number of redundant symbols being less than the first fixed number of redundant symbols.

Another embodiment of the invention may therefore further comprise a method of generating Reed-Solomon redundant symbols, comprising: receiving a first set of information symbols; processing the first set of information symbols to produce a second set of information symbols; generating a first set of redundant symbols with a Reed-Solomon encoder configured to produce a first number of redundant symbols using a fixed encoding polynomial; and, processing the first set of redundant symbols to produce a second set of redundant symbols with a second number of redundant symbols, wherein the second number of redundant symbols is less than the first number of redundant symbols.

Another embodiment of the invention may therefore further comprise a Reed-Solomon encoder, comprising: a systematic Reed-Solomon encoder configured to produce a first fixed number of redundant symbols, wherein the systematic Reed-Solomon encoder is configured with an encoding polynomial that is fixed; a first Galois Field multiplier receiving a sequence of information symbols and a sequence of inverted transformation coefficients; a second Galois Field multiplier receiving a sequence of redundant symbols from the systematic Reed-Solomon encoder and a sequence of transformation coefficients, wherein the sequence of redundant symbols has fewer than the first fixed number of redundant symbols; a transformation coefficient inverter that receives the sequence of transformation coefficients and produces the sequence of inverted transformation coefficients by performing at least a Galois Field inversion; a transformation coefficient generator that produces the sequence of transformation coefficients by evaluating a transformation polynomial at successive powers of a primitive element of a Galois Field of the encoding polynomial.

BRIEF DESCRIPTION OF THE DRAWINGS

FIG. 1 is a block diagram illustrating a Reed-Solomon encoder with a variable number of redundant symbols.

FIG. 2 is a flowchart illustrating a method of Reed-Solomon encoding.

FIG. 3 is a block diagram illustrating a Reed-Solomon encoder with a variable number of redundant symbols.

DETAILED DESCRIPTION

FIG. 1 is a block diagram illustrating a Reed-Solomon encoder with a variable number of redundant symbols. Reed-Solomon encoder 100 comprises symbol preprocessor 110; fixed length Reed-Solomon encoder 120; symbol postprocessor 130. Symbol preprocessor 110 receives input data symbols. Symbol preprocessor sends transformed input data symbols 112 to fixed length Reed-Solomon encoder 120. Fixed length Reed-Solomon encoder 120 sends redundant symbols 122 to symbol postprocessor 130. Symbol postprocessor 130 produces output redundant symbols. Fixed length Reed-Solomon encoder 120 may be implemented by a linear feedback shift register (LFSR) with Galios Field multipliers configured with at least one multiplicand as a constant.

In an embodiment, the output redundant symbols produced by Reed-Solomon encoder 100 may be a different number of redundant symbols than fixed length Reed-Solomon encoder 120 is configured to produce. For example, if fixed length Reed-Solomon encoder 120 is configured to produce redundant symbols for an RS(7,3) code, preprocessing by symbol preprocessor 110 and postprocessing by symbol postprocessor 130 allow Reed-Solomon encoder 100 to produce redundant symbols for an RS(5,3) code. Because the number of redundant symbols produced for an RS(7,3) code is 4, and the number of redundant symbols produced for an RS(5,3) code is 2, the output redundant symbols produced by Reed-Solomon encoder 100 is a different number of redundant symbols than fixed length Reed-Solomon encoder 120 is configured to produce. Thus, by turning preprocessing by symbol preprocessor 110 and postprocessing by symbol postprocessor 130 on or off, Reed-Solomon encoder 100 may produce a variable number of redundant symbols.

Symbol preprocessor 110 transforms each input data symbol. This transformation may comprise multiplying each input data symbol by the inverse of a corresponding one of a series of transformation coefficients. This multiplication would typically be a Galois Field multiplication. Likewise, the inverses of the series of transformation coefficients would be produced using Galois Field arithmetic.

To produce the series of transformation coefficients, symbol preprocessor 110 may evaluate a transformation polynomial at successive powers of a primitive element. The primitive element is a primitive element of the Galois Field used by the encoding (or generating) polynomial of fixed length Reed-Solomon encoder 120. Thus, the primitive element ($\alpha$)

is a root of the generating polynomial of fixed length Reed-Solomon encoder 120. The transformation polynomial may be based on a set of coefficients from the polynomial:

$$\Psi(x) = \prod_{l=1}^{\rho} (1 - \alpha^l x)$$

where $\rho$ is the difference between the number of redundant symbols produced by fixed length Reed-Solomon encoder 120 and the number of redundant symbols produced by Reed-Solomon encoder 100. The primitive element ($\alpha$) is a primitive element of the encoding polynomial of the fixed length Reed-Solomon encoder 120.

For example, the coefficients of the polynomial $\Psi(x)$ may be enumerated as follows:

$$\Psi(x) = \prod_{l=1}^{\rho} (1 - \alpha^l x) = \Psi_0 + \Psi_1 x + \Psi_2 x^2 + \ldots + \Psi_\rho x^\rho$$

These enumerated coefficients may be used to produce a transformation polynomial ($\overline{\Psi}(x)$) as follows:

$$\overline{\Psi}(x) = \Psi_\rho + \Psi_{\rho-1} x + \Psi_{\rho-2} x^2 + \ldots + \Psi_0 x^\rho$$

Symbol preprocessor 110 may then use the transformation polynomial $\overline{\Psi}(x)$ to produce the series of transformation coefficients. For example, symbol preprocessor 110 may evaluate the transformation polynomial $\overline{\Psi}(x)$ at successively higher powers of primitive element $\alpha$ (e.g., $\alpha, \alpha^2, \alpha^3$, etc.). Each of these evaluations produces a transformation coefficient ($a_i$). E.g., $a_1 = \overline{\Psi}(\alpha)$, $a_2 = \overline{\Psi}(\alpha^2)$, $a_3 = \overline{\Psi}(\alpha^3)$ etc. The inverse of each transformation coefficient (e.g., $a_1^{-1}, a_2^{-1}, a_3^{-1}$, etc.) is multiplied by a corresponding input data symbol to transform the corresponding input data symbol. This produces the series of transformed input data symbols 112 that are sent to fixed length Reed-Solomon encoder 120.

Symbol postprocessor 130 receives redundant symbols 122 from fixed length Reed-Solomon encoder 120. Symbol postprocessor 130 may multiply at least the redundant symbols 122 produced by fixed length Reed-Solomon encoder 120 as it encoded the transformed input data symbols 112 by a corresponding transformation coefficient. The results of this multiplication are redundant symbols of a Reed-Solomon code that has $\rho$ fewer redundant symbols than fixed length Reed-Solomon encoder 120 is configured to produce.

In an embodiment, symbol postprocessor 130 also receives the series of transformed input data symbols 112 that were sent to fixed length Reed-Solomon encoder 120. Symbol postprocessor 130 may then multiply the transformed input data symbols 112 by a corresponding transformation coefficient. This undoes the transformation done by symbol preprocessor 110 so that the data symbols output by Reed-Solomon encoder 100 are the same as the untransformed input data symbols. In other words, Reed-Solomon encoder 100 is a systemic Reed-Solomon encoder.

Figure 2:
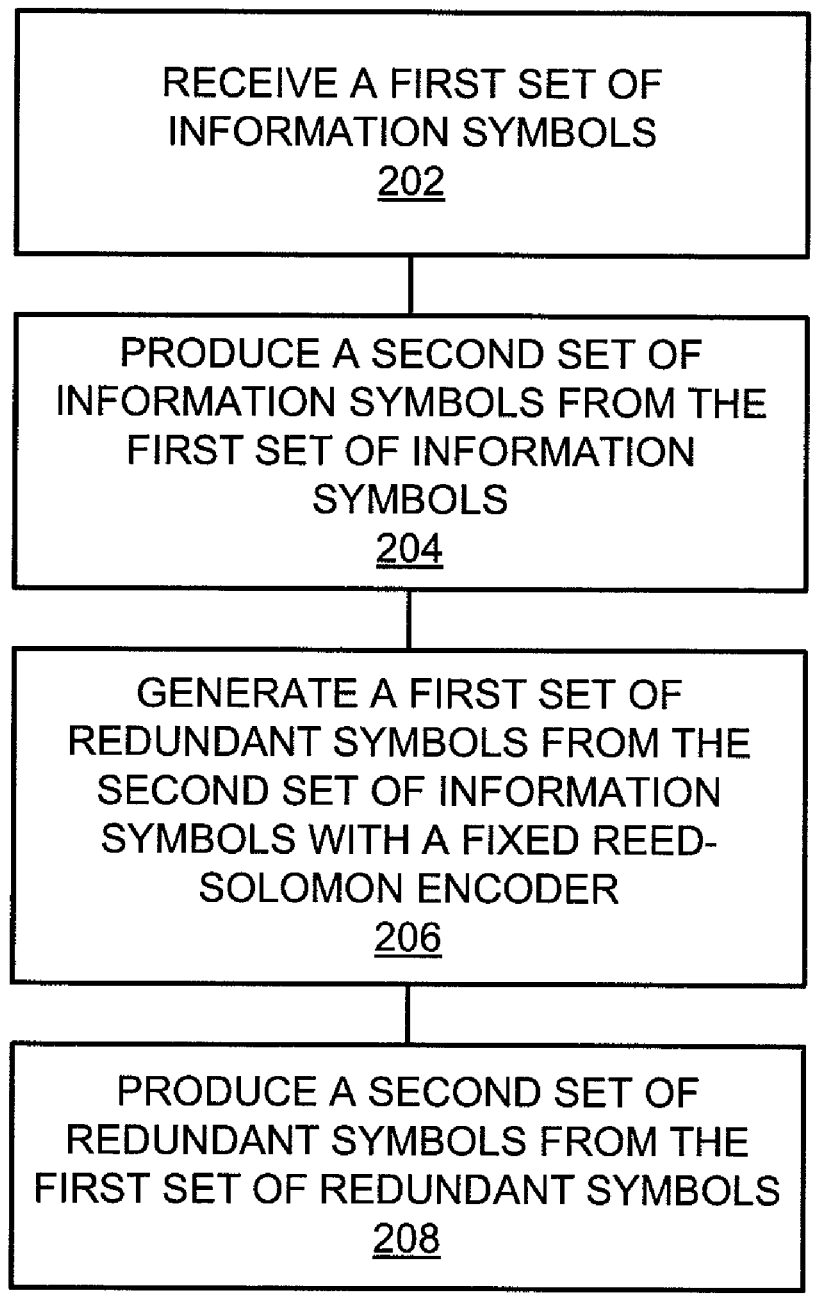

FIG. 2 is a flowchart illustrating a method of Reed-Solomon encoding. A first set of information symbols are received (202). For example, Reed-Solomon encoder 100 or symbol preprocessor 110 may receive input data symbols. A second set of information symbols is produced from the first set of information symbols (204). For example, symbol preprocessor 110 may produce transformed input data symbols 112 from the input data symbols that symbol preprocessor 110 received in step 202.

A first set of redundant symbols is generated by a fixed Reed-Solomon encoder from the second set of information symbols (206). For example, fixed length Reed-Solomon encoder 120 may generate redundant symbols 122 from transformed input data symbols 112.

A second set of redundant symbols is produced from the first set of redundant symbols (208). For example, symbol postprocessor 130 may produce output redundant symbols from the redundant symbols symbol postprocessor 130 received from fixed length Reed-Solomon encoder 120.

Figure 3:
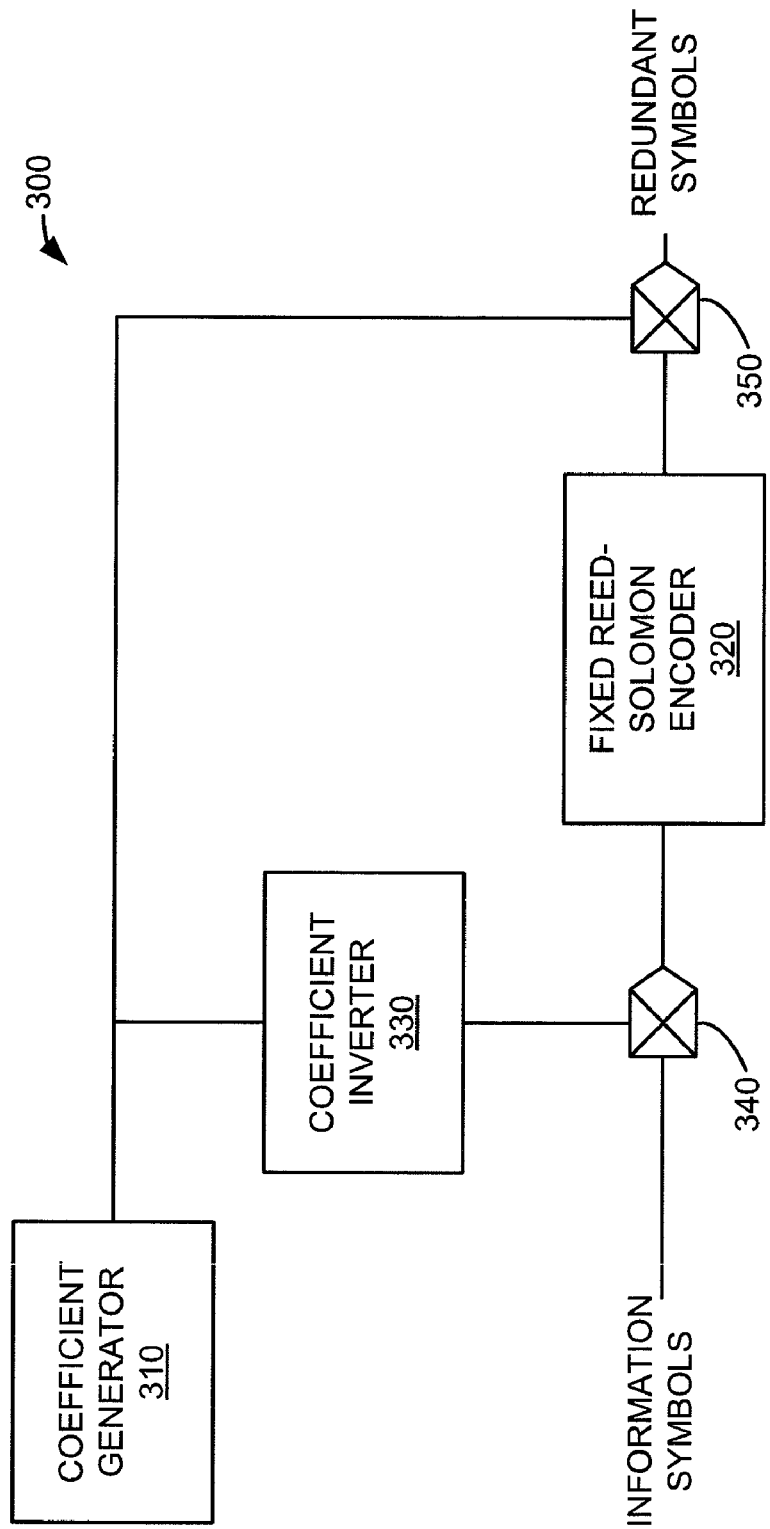

FIG. 3 is a block diagram illustrating a Reed-Solomon encoder with a variable number of redundant symbols. In FIG. 3, Reed-Solomon encoder 300 comprises: coefficient generator 310; fixed Reed-Solomon encoder 320; coefficient inverter 330; Galois Field multiplier 340; and Galois Field multiplier 350. Coefficient generator 310 is operatively coupled to the input of coefficient inverter 330 and a first input of Galois Field multiplier 350. Thus, Coefficient generator 310 may supply a series of transformation coefficients to coefficient inverter 330 and Galois Field multiplier 350.

Coefficient inverter 330 produces a series of inverted transformation coefficients. This series of inverted transformation coefficients is the result of a mathematical Galois Field inversion (e.g., y=1/x) of the received transformation coefficients.

The output of coefficient inverter 330 is operatively coupled to a first input of Galois Field multiplier 340. The second input of Galois Field multiplier 340 receives the information symbols that are to be Reed-Solomon encoded by Reed-Solomon encoder 300. Thus, the output of Galois Field multiplier 340 comprises a series of transformed information symbols. The transformation of these input symbols comprises the multiplication of each input information symbol by the inverse of a corresponding transformation coefficient.

The output of Galois Field multiplier 340 is operatively coupled to the input of fixed Reed-Solomon encoder 320. Thus, fixed Reed-Solomon encoder 320 encodes the series of transformed information symbols received from Galois Field multiplier 340. Fixed Reed-Solomon encoder 320 may be implemented by a linear feedback shift register (LFSR) with Galios Field multipliers configured with at least one multiplicand as a constant.

The output of fixed Reed-Solomon encoder 320 is operatively coupled to a second input of Galois Field multiplier 350. Thus, Galois Field multiplier 350 multiplies the series of redundant symbols received from fixed Reed-Solomon encoder 320 by the series of transformation coefficients produced by coefficient generator 310. This produces a series of redundant symbols that comprise an output of Reed-Solomon encoder 300. In an embodiment, the number of redundant symbols produced by Reed-Solomon encoder 300 is less than the number of redundant symbols fixed Reed-Solomon encoder 320 is configured to produce.

To produce the series of transformation coefficients, coefficient generator 310 may evaluate a transformation polynomial at successive powers of a primitive element. The primitive element is a primitive element of the Galois Field used by the encoding (or generating) polynomial of fixed Reed-Solomon encoder 320. Thus, the primitive element ($\alpha$) is a root of the generating polynomial of fixed Reed-Solomon encoder 320. The transformation polynomial may be based on a set of coefficients from the polynomial:

$$\Psi(x) = \prod_{l=1}^{\rho}(1-\alpha^l x)$$

where $\rho$ is the difference between the number of redundant symbols produced by fixed Reed-Solomon encoder 320 and the number of redundant symbols produced by Reed-Solomon encoder 300. The primitive element ($\alpha$) is a primitive element of the encoding polynomial of the fixed Reed-Solomon encoder 320.

The coefficients of polynomial $\Psi(x)$ may be enumerated as follows:

$$\Psi(x) = \prod_{l=1}^{\rho}(1-\alpha^l x) = \Psi_0 + \Psi_1 x + \Psi_2 x^2 + \ldots + \Psi_\rho x^\rho$$

These enumerated coefficients may be used to produce a transformation polynomial ($\overline{\Psi}(x)$) as follows:

$$\overline{\Psi}(x) = \Psi_\rho + \Psi_{\rho-1}x + \Psi_{\rho-2}x^2 + \ldots + \Psi_0 x^\rho$$

Coefficient generator 310 may then use the transformation polynomial $\overline{\Psi}(x)$ to produce the series of transformation coefficients. For example, Coefficient generator 310 may evaluate the transformation polynomial $\overline{\Psi}(x)$ at successively higher powers of primitive element $\alpha$ (e.g., $\alpha$, $\alpha_2$, $\alpha_3$, etc.). Each of these evaluations produces a transformation coefficient ($a_i$). E.g., $a_1=\overline{\Psi}(\alpha)$, $a_2=\overline{\Psi}(\alpha^2)$, $a_3=\overline{\Psi}(\alpha^3)$, etc. This series of transformation coefficients are provided to coefficient inverter 330 and Galois Field multiplier 350.

Reed-Solomon encoder 100, Reed-Solomon encoder 300, and the method illustrated in FIG. 2 are further illustrated by the following discussion. Denote by GF(q) a Galois Field with q elements. Let $q=2^d$ and $n=q-1$. For each Reed-Solomon (RS) code sequence $c=(c_0, c_1, \ldots, c_{n-1})$ with elements from GF(q) consider the polynomial $c(x)=c_0+c_1 x + \ldots + c_{n-1}x^{n-1}$. Let $i_0 \in \{0, 1, \ldots, n-1\}$ and $\alpha$ be a primitive element of GF(q). The set of all sequences $c=(c_0, c_1, \ldots, c_{n-1})$ such that $c(\alpha^i)=0$ for $i=i_0, \ldots, i_0+2t-1$ is called a primitive RS(n,n-2t,t)-code. These sequences are referred to as codewords of this RS code. This code has minimum distance $2t+1$. Thus, this code can correct up to t errors.

The number $k=n-2t$ defines the number of information symbols in codeword. These information symbols are denoted $d_0, \ldots, d_{k-1}$ and comprise data to be transmitted. Hence, the number of redundant (a.k.a., parity symbols) are equal to 2t. An RS-encoder is a device that transforms information message $d=(d_0, \ldots, d_{k-1})$ into codeword $c=(c_0, c_1, \ldots, c_{n-1})$ of RS-code.

A method for transforming an information message to codeword is as follows. The process starts with a generator polynomial (g(x)) equal to:

$$g(x) = \prod_{i=i_0}^{i_0+2t-1}(x - \alpha^i).$$

Let $d(x)=d_0+\ldots+d_{k-1}x^{k-1}$ and $c(x)=c_0+\ldots+c_{n-1}x^{n-1}$. The encoder performs the transformation $d(x) \mapsto x^{n-k}d(x)+p(x)$, where $p(x)=x^{n-k}d(x) \bmod g(x)$. In an embodiment, this encoder may be fixed length Reed-Solomon encoder 120 or fixed Reed-Solomon encoder 320. Because $c_{n-k}=d_0, \ldots, c_{n-1}=d_{k-1}$ and the encoder is said to be in systematic form.

Consider a new number of correctable errors t', where $0<t'<t$. Also, fix some positions $j_1, \ldots, j_\rho \in \{0, 1, \ldots, n-1\}$, where $\rho=2(t-t')$. Map from RS(n,n-2t,t)-code to the set of codewords $c'=(c'_0, \ldots, c'_{n-1})$ of RS(n,n-2t',t')-code such that $c'_{j_1}=\ldots=c'_{j_\rho}=0$. This transformation is applied to obtain an RS systematic encoder for t' errors using an RS systematic encoder configured for t errors. In other words, apply a transformation that allows a RS(n,n-2t, t)-code encoder to produce codewords for a RS(n, n-2t',t')-code.

To construct the mapping, a discrete Fourier transform $F_n$: $GF(q)^n \to GF(q)^n$ maps each vector $v=(v_0, \ldots, v_{n-1})$ over GF(q) into a vector $V=(V_0, \ldots, V_{n-1})$ over GF(q) as follows:

$$V_i = v(\alpha^i) = \sum_{j=0}^{n-1} v_j \alpha^{ij},$$

where $\alpha$ is a primitive element of GF(q) (and thus is also a root of g(x)).

To create the mapping the following polynomial is used:

$$\Psi(x) = \prod_{l=1}^{\rho}(1-\alpha^{j_l}x).$$

Let $\Psi=(\Psi_0, \ldots, \Psi_\rho, 0, \ldots, 0) \in GF(q)^n$ be the vector of the coefficients of the $\Psi(x)$ polynomial. Define $\psi=(\psi_0, \ldots, \psi_{n-1})=F_n^{-1}(\Psi)$, where $F_n^{-1}$ is an inverse discrete Fourier transform. It is known that $\psi_i=\Psi(\alpha^{-i})$ for $i=0, \ldots, n-1$. Hence $\psi_{j_l}=0$ for $l=1, \ldots, \rho$. It is also known that for two vectors $v, u \in GF(q)^n$ then for the vector $w=vu$, $F_n(w)=W=V*U$, where $w_i=v_i u_i$ and $i=0, \ldots, n-1$. $V=F_n(v)$, $U=F_n(u)$. $V*U$ is a convolution of V and U. In other words:

$$W_i = \sum_{j=0}^{n-1} V_j U_{(i-j) \bmod n}, i=0, \ldots, n-1.$$

Define the map on codewords as follows: $c \mapsto c'=c\psi$. Vector $C'=F_n(c')=C*\Psi$, where $C=F_n(c)$. Because c is a codeword, it follows that $C_{i_0}=\ldots=C_{i_0+2t-1}=0$. Note that $\Psi=(\Psi_0, \ldots, \Psi_\rho, 0, \ldots, 0)$ and $C'=C*\Psi$, so:

$$C'_{i_0+\rho} = C_{i_0+\rho}\Psi_0 + \ldots + C_{i_0}\Psi_\rho = 0,$$

$$C'_{i_0+\rho+1} = C_{i_0+\rho+1}\Psi_0 + \ldots + C_{i_0+1}\Psi_\rho = 0,$$

$$\vdots$$

$$C'_{i_0+2t-1} = C_{i_0+2t-1}\Psi_0 + \ldots + C_{i_0+2t-\rho-1}\Psi_\rho = 0,$$

and $c'(\alpha^{i_0+\rho})=\ldots=c'(\alpha^{i_0+2t-1})=0$. Thus, c' is a codeword of an RS-code with t' errors and $c'_{j_l}=c_{j_l}\psi_{j_l}=0$ for $l=1, \ldots, \rho$.

The conditions $c'(\alpha^{i_0})=\ldots=c'(\alpha^{i_0+2t'-1})=0$ may be obtained if the map $c_i \mapsto c''_i=\alpha^{\rho i}c_i\psi_i$ is used instead of $c_i \mapsto c'_i=c_i\psi_i$. Using this map, $c''(\alpha^i)=c'_0+\alpha^\rho c'_1 \alpha^i + \ldots + \alpha^{\rho(n-1)}c'_{n-1}\alpha^{i(n-1)}=c'(\alpha^{\rho+i})=0$ for $i=i_0, \ldots, i_0+2t'-1$.

A systematic RS-encoder, denoted E, has the capability to correct t errors. This RS-encoder transforms a message $$(\underbrace{0, \ldots, 0}_{2t}, d_{2t}, \ldots, d_{n-1})$$

into codeword $(c_0, \ldots, c_{n-1})$. For $(c_0, \ldots, c_{n-1})$, where $k=n-2t$, the symbols $c_{2t}=d_0, \ldots, c_{n-1}=d_{k-1}$ are information symbols. The symbols $c_0, \ldots, c_{2t-1}$ are redundant (also known as parity) symbols.

Reed-Solomon encoding with an error correction capability of t' errors $0<t'<t$, (denoted E') may be accomplished using a fixed length encoder such as fixed length Reed-Solomon encoder 120 or fixed Reed-Solomon encoder 320. Reed-Solomon encoder 100 and Reed-Solomon encoder 300 are examples of an E' encoder. A shortened version of E that performs the transformation $$(\underbrace{0, \ldots, 0}_{2t'}, d_{2t'}, \ldots, d_{n-1}) \mapsto (c_\rho, \ldots, c_{n-1})$$

is used. Let $j_1=0, \ldots, j_\rho=\rho-1$. A corresponding $\Psi(x)=\Psi_0+\ldots+\Psi_\rho x^\rho$ is calculated. Transformation coefficients $(\alpha_i)$ are defined for $i=0, \ldots, n-1$ as:

$$a_i = \alpha^{\rho i}\psi_i = \alpha^{\rho i}\Psi(\alpha^{-i}) = \Psi_\rho + \ldots + \Psi_0 \alpha^{\rho i}$$

The polynomial $\overline{\Psi}(x)=\Psi_\rho+\ldots+\Psi_0 x^\rho$ is defined to generate the transformation coefficients. Thus, $a_i=\overline{\Psi}(\alpha^i)$. The inverse of each $\alpha_i$ is multiplied by each information symbol $d_i$, $i=2t, \ldots n-1$, before they are input to fixed encoder E. This produces the transformation $d_i | \to d_i a_i^{-1}$. After Reed-Solomon encoding the transformed information symbols by fixed encoder E, at least each redundant symbol generated by fixed encoder E is multiplied by a corresponding transformation coefficient $a_i$. The information symbols for the rest of the codeword may be taken directly from the untransformed information symbols.

As an alternative, each codeword symbol $c_i$, for $i=\rho, \ldots, n-1$, from the output of E may be multiplied by a corresponding $a_i$. This produces the transformation $c_i | \to a_i c_i$. Thus, the information symbols are returned to their untransformed values. Thus E' is a systematic encoder because $c_i = d_i a_i^{-1} a_i = d_i$ for $i=2t, \ldots, n-1$.

The implementation of the E' encoder may be pipelined. For example, fixed Reed-Solomon encoder 320 may have a delay of one clock. Coefficient inverter 330 may have a delay of s clocks. Coefficient generator 310 may take 2 clocks to produce the first coefficient. Thus, fixed Reed-Solomon encoder 320 should wait s+2 clocks after coefficient generator 310 starts before starting to encode. Likewise, the first information symbols should not be input to Galois Field multiplier 340 until s+2 clocks after coefficient generator 310 starts. The coefficients generated by coefficient generator 310 should be delayed by s+1 clocks before being input to Galois Field multiplier 350.

These pipeline delays and timings ensure that the corresponding information symbol is multiplied by the corresponding inverse of a transformation coefficient before being input to fixed Reed-Solomon encoder 320. These pipeline delays and timings also ensure that the corresponding information or redundant symbol output from fixed Reed-Solomon encoder 320 is multiplied by the transformation coefficient.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A Reed-Solomon encoder with a variable number of redundant symbols, comprising:
   a fixed length Reed-Solomon encoder configured to produce a first fixed number of redundant symbols, said fixed length Reed-Solomon encoder being configured with an encoding polynomial that is fixed;
   a symbol preprocessor to map each input data symbol to a transformed input data symbol, the symbol preprocessor to multiply each input data symbol by an inverse of one of a set of transformation coefficients, the set of transformation coefficients corresponding to the result of a transformation polynomial evaluated at a fixed number of powers of a primitive element of a Galois Field of an encoding polynomial of the fixed length Reed-Solomon encoder, the transformation polynomial based on a set of coefficients from the polynomial:

$$\Psi(x) = \prod_{l=1}^{\rho} (1 - \alpha^l x)$$

wherein $\rho$ is a difference between the second fixed number of redundant symbols and the first fixed number of redundant symbols, and $\alpha$ is the primitive element of the Galois Field of the encoding polynomial of the fixed length Reed-Solomon encoder; and,
   a symbol postprocessor to map a second fixed number of redundant symbols output from the fixed length Reed-Solomon encoder to a set of redundant symbols, said second fixed number of redundant symbols being less than the first fixed number of redundant symbols, the symbol postprocessor to multiply each symbol of the set of redundant symbols by a corresponding one of the set of transformation coefficients.

2. The Reed-Solomon encoder of claim 1, wherein:

$$\Psi(x) = \prod_{l=1}^{\rho} (1 - \alpha^l x) = \Psi_0 + \Psi_1 x + \Psi_2 x^2 + \ldots + \Psi_\rho x^\rho$$

and the transformation polynomial ($\overline{\Psi}(x)$) is:

$$\overline{\Psi}(x) = \Psi_\rho + \Psi_{\rho-1} x + \Psi_{\rho-2} x^2 + \ldots + \Psi_0 x^\rho.$$

3. The Reed-Solomon encoder of claim 2, wherein the transformation coefficients are $a_i = \overline{\Psi}(\alpha^i)$.

4. A method of generating Reed-Solomon redundant symbols, comprising:
   receiving a first set of information symbols;
   processing the first set of information symbols to produce a second set of information symbols, the processing the first set of information symbols comprising multiplying each of the first set of information symbols by an inverse of a corresponding one of a set of transformation coefficients;

generating a first set of redundant symbols with a Reed-Solomon encoder configured to produce a first number of redundant symbols using a fixed encoding polynomial; and, processing the first set of redundant symbols to produce a second set of redundant symbols with a second number of redundant symbols, wherein the second number of redundant symbols is less than the first number of redundant symbols, the processing the first set of redundant symbols comprising multiplying each of the first set of redundant symbols by the corresponding one of the set of transformation coefficients; and, generating the set of transformation coefficients by evaluating a transformation polynomial at a fixed number of powers of a primitive element of a Galois Field of the fixed encoding polynomial, the transformation polynomial based on a set of coefficients from the polynomial:

$$\Psi(x) = \prod_{l=1}^{\rho} (1 - \alpha^l x)$$

wherein ρ is a difference between the second number of redundant symbols and the first number of redundant symbols, and α is the primitive element of the Galois Field of the encoding polynomial.

5. The method of claim 4, wherein:

$$\Psi(x) = \prod_{l=1}^{\rho} (1 - \alpha^l x) = \Psi_0 + \Psi_1 x + \Psi_2 x^2 + \ldots + \Psi_\rho x^\rho$$

and the transformation polynomial ($\overline{\Psi}(x)$) is:

$$\overline{\Psi}(x) = \Psi_\rho + \Psi_{\rho-1} x + \Psi_{\rho-2} x^2 + \ldots + \Psi_0 x^\rho.$$

6. The Reed-Solomon encoder of claim 5, wherein the transformation coefficients are $a_i = \overline{\Psi}(\alpha^i)$.

7. A Reed-Solomon encoder, comprising:
a systematic Reed-Solomon encoder configured to produce a first fixed number of redundant symbols, wherein the systematic Reed-Solomon encoder is configured with an encoding polynomial that is fixed;
a first Galois Field multiplier receiving a sequence of information symbols and a sequence of inverted transformation coefficients;
a second Galois Field multiplier receiving a sequence of redundant symbols from the systematic Reed-Solomon encoder and a sequence of transformation coefficients, wherein the sequence of redundant symbols has fewer than the first fixed number of redundant symbols;
a transformation coefficient inverter that receives the sequence of transformation coefficients and produces the sequence of inverted transformation coefficients by performing at least a Galois Field inversion; and,
a transformation coefficient generator that produces the sequence of transformation coefficients by evaluating a transformation polynomial at successive powers of a primitive element of a Galois Field of the encoding nolynnmial.

8. The Reed-Solomon encoder of claim 7, wherein the transformation polynomial is based on a set of coefficients from the polynomial:

$$\Psi(x) = \prod_{l=1}^{\rho} (1 - \alpha^l x)$$

wherein ρ is a difference between the second number of redundant symbols and the first number of redundant symbols, and α is the primitive element of the Galois Field of the encoding polynomial.

9. The Reed-Solomon encoder of claim 8, wherein:

$$\Psi(x) = \prod_{l=1}^{\rho} (1 - \alpha^l x) = \Psi_0 + \Psi_1 x + \Psi_2 x^2 + \ldots + \Psi_\rho x^\rho$$

and the transformation polynomial ($\overline{\Psi}(x)$) is:

$$\overline{\Psi}(x) = \Psi_\rho + \Psi_{\rho-1} x + \Psi_{\rho-2} x^2 + \ldots + \Psi_0 x^\rho.$$

10. The Reed-Solomon encoder of claim 9, wherein the sequence of transformation coefficients are based on evaluating $\overline{\Psi}(x)$ at successive powers of α.

11. The Reed-Solomon encoder of claim 10, wherein the second Galois Field multiplier receives the sequence of information symbols from the systematic Reed-Solomon encoder.

12. The Reed-Solomon encoder of claim 7, wherein first fixed number of redundant symbols is 2t, and the sequence of redundant symbols has 2t' symbols, and t' is a number of errors that the sequence of redundant symbols can correct in the sequence of information symbols.

13. A Reed-Solomon encoder with a variable number of redundant symbols, comprising:
a fixed length Reed-Solomon encoder configured to produce a first fixed number of redundant symbols, said fixed length Reed-Solomon encoder being configured with an encoding polynomial that is fixed;
a symbol preprocessor to map each input data symbol to a transformed input data symbol, the symbol preprocessor to Galois Field multiply each input data symbol by an inverse of one of a set of transformation coefficients,
a symbol postprocessor to map a second fixed number of redundant symbols output from the fixed length Reed-Solomon encoder to a set of redundant symbols, said second fixed number of redundant symbols being less than the first fixed number of redundant symbols, the symbol postprocessor to Galois Field multiply each symbol of the set of redundant symbols by a corresponding one of the set of transformation coefficients;
a transformation coefficient inverter to produce the inverses of the ones of the set of transformation coefficients from the set of transformation coefficients by performing at least a Galois Field inversion; and,
a transformation coefficient generator to produce the set of transformation coefficients by evaluating a transformation polynomial at successive powers of a primitive element of a Galois Field of the encoding polynomial.

14. A method of generating Reed-Solomon redundant symbols, comprising:
receiving a first set of information symbols;
processing the first set of information symbols to produce a second set of information symbols, the processing the first set of information symbols comprising multiplying each of the first set of information symbols by an inverse of a corresponding one of a set of transformation coefficients;

generating a first set of redundant symbols with a Reed-Solomon encoder configured to produce a first number of redundant symbols using a fixed encoding polynomial; and, processing the first set of redundant symbols to produce a second set of redundant symbols with a second number of redundant symbols, wherein the second number of redundant symbols is less than the first number of redundant symbols, the processing the first set of redundant symbols comprising multiplying each of the first set of redundant symbols by the corresponding one of the set of transformation coefficients; and, generating the set of transformation coefficients by evaluating a transformation polynomial at successive powers of a primitive element of a Galois Field of the fixed encoding polynomial.

* * * * *